May 16, 1967 CHU QUON LEE 3,320,516

FREQUENCY MULTIPLIER STRUCTURE WHEREIN A DISTRIBUTED PARAMETER CIRCUIT IS COMBINED WITH A LUMPED PARAMETER CIRCUIT

Filed Sept. 16, 1963

INVENTOR.
Chu Quon Lee.
BY Mueller & Aichele
Attys.

United States Patent Office 3,320,516
Patented May 16, 1967

3,320,516

FREQUENCY MULTIPLIER STRUCTURE WHEREIN A DISTRIBUTED PARAMETER CIRCUIT IS COMBINED WITH A LUMPED PARAMETER CIRCUIT

Chu Quon Lee, Maywood, Ill., assignor to Motorola, Inc., Franklin Park, Ill., a corporation of Illinois Filed Sept. 16, 1963, Ser. No. 309,150
5 Claims. (Cl. 321—69)

This invention relates to frequency multipliers and in particular to a frequency multiplier incorporating a variable capacitance varactor diode and having a high order of frequency multiplication.

A frequency multiplier circuit which use a varactor diode as the harmonic generator requires, for optimum efficiency, that the fundamental frequency be prevented from dissipating energy in the load, and that the output frequency be prevented from dissipating energy in the source impedance. In addition, to achieve the highest efficiency in frequency multiplier circuits which multiply by integers greater than two, it is necessary to incorporate idler frequency circuits which will permit harmonic frequencies other than the fundamental and output harmonic frequencies to flow through the varactor diode without dissipating energy in either the load or the source impedance.

When the output harmonic frequency is a large multiple of the input frequency it has been found that the necessary filters preferably will make use of different forms of circuit parameters. Lumped parameters are used for the fundamental frequency and low harmonic frequency idler circuits which might be in the VHF-UHF region, while the high harmonic frequency idler circuits and the output frequency circuits, which can be in the microwave region, may be of the distributed parameter type. Each of these different types of circuits must be coupled to the varactor diode in a manner which will permit the various currents of different frequencies to flow through the varactor diode with a minimum of energy dissipation.

It is therefore an object of this invention to provide a simple and efficient frequency multiplier circuit wherein the output harmonic frequency is a large multiple of the input frequency.

A further object of the invention is to provide a frequency multiplier circuit utilizing a varactor diode wherein the input, output and idler frequency currents each flow through the varactor diode with a minimum of dissipation of energy.

Another object of this invention is to provide a structure which combines circuits having distributed parameters with those having lumped parameters for use in a frequency multiplier circuit.

A feature of this invention is the provision of a frequency multiplier structure including a lumped constant input circuit, a transmission line having an adjustable length and a waveguide having therein a varactor diode with the varactor diode coupled to the center conductor of the transmission line, and the input circuit coupled to the outer conductor thereof. The multiplied frequency is coupled from the varactor diode to a load by a waveguide and an output filter.

Another feature of this invention is the provision of a transmission line having a shoulder on the center conductor separated from a bushing by a dielectric material to form a capacitor, and a sleeve of dielectric material separating the bushing and the outer conductor of the transmission line to form a second capacitor.

The invention is illustrated in the drawings wherein.

Figures 1, 2, 3, 4:
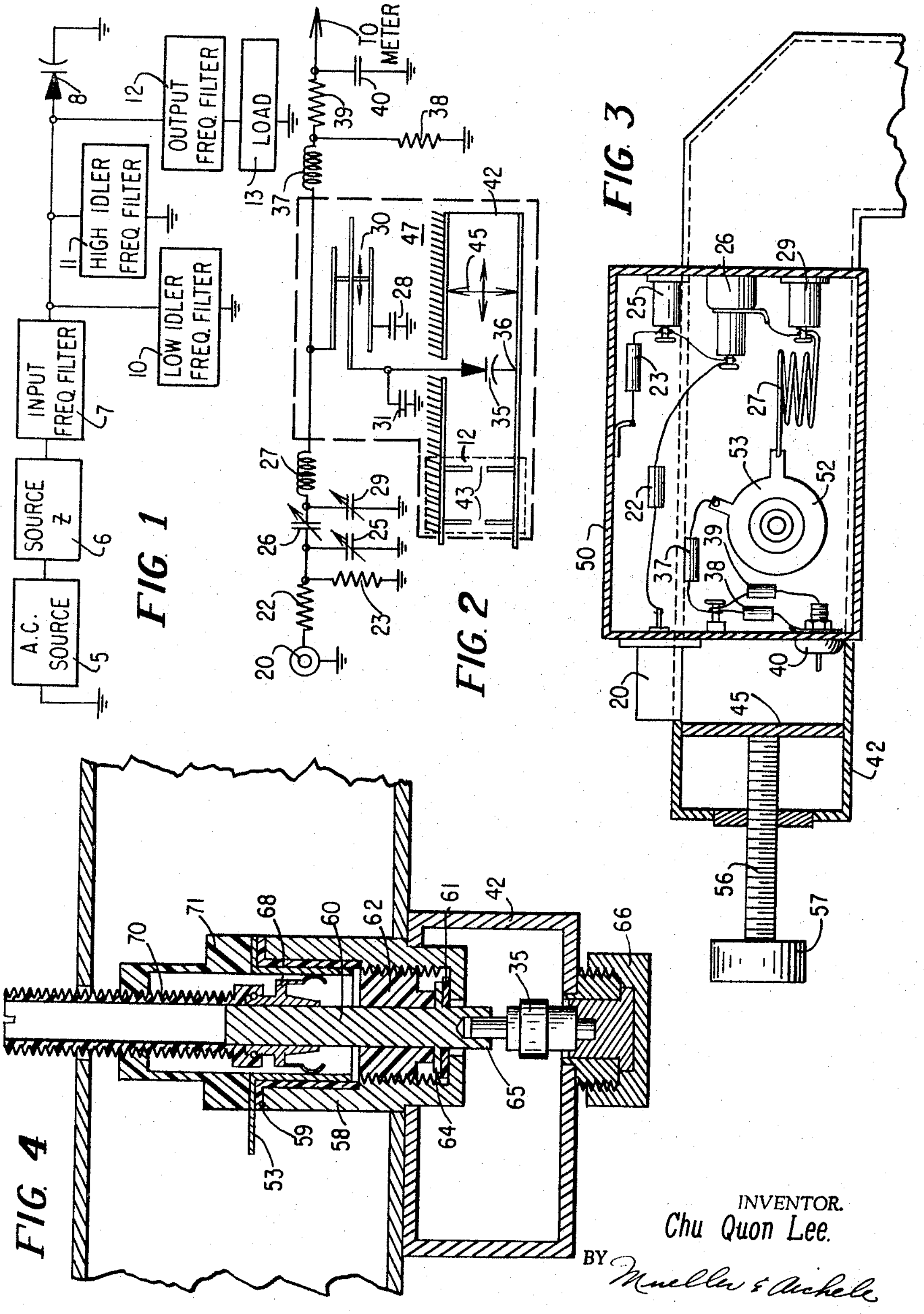
FIG. 1 is a block diagram of the frequency multiplier of this invention.
FIG. 2 is a schematic diagram of the frequency multiplier shown in FIG. 1.
FIG. 3 is an illustration of the structure incorporating the circuit elements shown in FIG. 2.
FIG. 4 is a cross-sectional view of the transmission line structure shown in FIG. 3.

In practicing this invention a frequency multiplier circuit is constructed which uses lumped parameter circuits and distributed parameter circuits in combination. The entire structure is contained within a shielded box made of conductive material. Those circuits having relatively low frequencies such as the input frequency and the low harmonic frequency idler circuits use components having lumped parameters while the high harmonic frequency idler circuits and the output circuit are contained in a structure in which the components have distributed parameters. This allows the use of components best suited to each frequency. The structure providing the high frequency circuit components is formed by a structure having an adjustable length transmission line with capacitors at each end of the line integrally provided, a varactor diode connected to the line and a waveguide containing the diode and a filter, and tuned to the output frequency for coupling signals to a load.

A frequency multiplier circuit for providing an output frequency 20 to 40 times the input frequency is shown in block diagram form in FIG. 1. A source 5 of alternating current, with source impedance 6, at a fundamental frequency $F_0$ is coupled to a varactor diode 8 through a filter 7, tuned to attenuate frequencies higher than $F_0$. Current at the fundamental frequency flows from the source 5 through the source impedance 6, filter 7 and varactor diode 8, and back through ground to the source 5. The current flowing through the varactor diode 8 generates harmonics of the fundamental frequency. In order to permit desired harmonic frequency idler currents to flow through the varactor diode 8, a low harmonic frequency idler filter 10 and a high harmonic frequency idler current filter 11 are coupled between the varactor diode 8 and ground. The load 13 is coupled to the varactor diode 8 by means of a filter 12 tuned to attenuate those frequencies other than the desired output harmonic frequency. Filter 12 and the waveguide prevent the undesired harmonic frequency currents from flowing in the load and thus dissipating energy unnecessarily.

As an example, the input frequency $F_0$ can be of the order of 180 to 200 megacycles and the output harmonic frequency can be of the order of 5400 to 8000 megacycles. This range is given by way of example and is not intended to limit this invention. The low harmonic frequency idler filter 10 is tuned to the second harmonic of the input frequency which is a frequency from 360 to 400 megacycles. The high harmonic frequency idler filter 11 is tuned to the 6th harmonic of the fundamental, or a frequency of from 1080 megacycles to 1200 megacycles. It can be seen that it is desirable to use circuits having lumped parameters for the filters 7 and 10 and to use circuits having distributed parameters for filters 11 and 12, because of the frequencies involved.

A schematic diagram of a circuit incorporating the features of FIG. 1 is shown in FIG. 2. The fundamental frequency is coupled to the frequency multiplier through connector 20. Resistors 22 and 23 form a pad which isolates the source from the frequency multiplier. Capacitors 25 and 26 together with inductor 27 form a matching and a series tuned circuit resonant at the fundamental frequency. This tuned circuit is the filter 7 of FIG. 1 and permits the fundamental frequency current flow through capacitor 26, inductor 27, and the adjustable transmission line 30 to the varactor diode 35. The output frequency signal is coupled to waveguide 42 by varactor diode 35. One end of the varactor diode 35 is grounded to the waveguide wall 36 which provides the return path for the fundamental frequency current. At the fundamental frequency, capacitors 28 and 31 have high impedances while the length of the transmission line 30 is only a small fraction of the wavelength of the fundamental frequency, thus these components have little effect on the fundamental frequency current. Choke 37, resistors 38 and 39 and capacitor 40 form a metering circuit and means for generating self bias for the varactor diode.

A filter, resonant at the second harmonic of the fundamental frequency, is formed by capacitor 29 and inductor 27 in series. This corresponds to filter 10 in FIG. 1 and provides a path for the second harmonic frequency idler current to flow from the varactor diode 35, where it is generated, through the waveguide 42 to ground, with the path being completed through capacitor 29, inductor 27 and the adjustable transmission line 30. At the second harmonic frequency capacitors 28 and 31 have high impedances and the adjustable transmission line 30 presents a low series inductance.

The structure 47 contains the varactor diode 35 and the elements which form the high idler frequency filter 11 and the output filter 12 of FIG. 1. The high harmonic frequency idler current, in this example the 6th harmonic, is generated in varactor diode 35 and flows through the waveguide 42 to ground, with the path continuing through capacitor 28 and the adjustable transmission line 30, and returning to the varactor diode 35. At the 6th harmonic frequency the adjustable transmission line 30 and the capacitance 28 form a series resonant circuit which has a low impedance to the 6th harmonic. The adjustable transmission line 30 and capacitor 28 thus form filter 11 of FIG. 1 and provide a low impedance path for the high harmonic frequency idler current to flow through varactor diode 35. At this harmonic frequency capacitor 31 presents a high impedance.

The output harmonic frequency is coupled from the varactor diode 35 to the load through the waveguide 42 and waveguide cavity filter 12. Cavity filter 12 consists of iris ports 43 positioned in waveguide 42 to transmit only the desired output harmonic frequency signal to the load. A shorting plunger 45 located in the waveguide 42 is adjusted to match the varactor to the waveguide at output frequency. Capacitor 31 acts as a bypass capacitor for the output harmonic frequency signal.

FIG. 3 shows the physical structure of the circuit shown in FIG. 2. Similar elements in FIGS. 2, 3 and 4 have the same numbers. The circuit is contained within an enclosed box of conductive material 50 and waveguide 42. The input fundamental frequency is coupled to the frequency multiplier circuit through coaxial connector 20. Resistors 22 and 23 which form a pad to isolate the source from the frequency multiplier are provided within the box 50. Variable capacitors 25, 26 and 29 are mounted on a wall of the box 50 so that they can be adjusted from outside the enclosed box. Capacitors 26 and 29 are coupled by inductor 27 to the transmission line filter structure 52, which will be described subsequently. Inductor 27 is connected to the outer conductor portion 53 of the adjustable transmission line as is the metering and biasing circuit consisting of choke 37, resistors 38 and 39 and feedthrough capacitor 40.

A cross sectional view of the transmission line filter structure 52 is shown in FIG. 4 together with the waveguide 42 to which it connects. The inductor 27 of FIG. 3 is coupled to the outer conductor 53, of the adjustable transmission line. The outer conductor 53 is spaced away from bushing 58 by means of a dielectric sleeve 59. Bushing 58 and outer conductor 53 together with the dielectric sleeve 59 form capacitor 28 of FIG. 2.

The outer conductor 53 and sleeve 59 are held in place by the dielectric support 71 which may be attached to bushing 58 by means of screws (not shown). A center conductor 60 is centrally located within bushing 58 and has a shoulder spaced away from bushing 58 by dielectric washer 61. The center conductor 60 is fixed in place and supported by a threaded dielectric nut 62. The shoulder 64 of center conductor 60 together with bushing 58 and dielectric 61 form capacitor 31 of FIG. 2. The end 65 of the center conductor 60 is adapted to hold a varactor diode 35 within the waveguide 42. A standard mounting 66 for a varactor diode is positioned in the waveguide opposite the end 65 of center conductor 60.

Center conductor 60 and outer conductor 53 form the adjustable coaxial transmission line 30 of FIG. 2. A shorting ring 68 of conductive material provides a means for adjusting the electrical length of the coaxial transmission line. This shorting ring is connected to a threaded dielectric rod 70 which cooperates with the dielectric support 71 to allow the shorting ring to be positioned along the length of the coaxial transmission line.

The output harmonic frequency generated by the varactor diode 35 is propagated through the waveguide and waveguide cavity filter to the load. The fundamental frequency and the second harmonic frequencies are coupled to the varactor through outer conductor 53, shorting ring 68 and center conductor 60. The return path for the input and second harmonic frequencies is through the waveguide 42 to which one end of the varactor diode 35 is connected. The high harmonic idler frequency current flows from the varactor diode 35 to the adjustable transmission line, consisting of outer conductor 53, center conductor 60 and shorting ring 68 and through the capacitor consisting of outer conductor 53, sleeve 59 and bushing 58 to ground. The adjustable transmission line and the capacitor thus described form a series resonant circuit which is adjusted to have a low impedance for the 6th harmonic. The 6th harmonic currents return to the varactor diode 35 through the waveguide 42. Output harmonic frequency currents generated by varactor diode 35 are prevented from reaching the remainder of the circuit by means of a bypass capacitor formed by the shoulder 64 of center conductor 60, dielectric washer 61 and the bushing 58 which form a bypass capacitor.

Thus a simple structure for a frequency multiplier has been shown which permits the use of lumped parameter circuits for the input and low harmonic frequency idler circuits and distributed parameter circuits for the high frequency harmonic idler current in the output frequency. This combination permits high order of multiplication using one varactor diode and a minimum of components.

I claim:

1. A frequency multiplier system for receiving an alternating current of a fundamental frequency and multiplying the same an integral number of times to form an output frequency, said system including in combination, a varactor diode, a structure including a coaxial line, first and second capacitors, and waveguide means, said varactor diode being positioned in said waveguide means and coupled thereto and being connected to said coaxial line, an input circuit for coupling said coaxial line to means providing the alternating current of fundamental frequency, said input circuit including a low pass filter portion tuned to attenuate harmonics of the fundamental frequency greater than the first harmonic, and a first band pass filter portion tuned to a low order idler harmonic frequency of the fundamental frequency, said first capacitor being coupled to said coaxial line and cooperating therewith to provide a second band pass filter tuned to a high order idler harmonic frequency of the fundamental frequency, said waveguide means coupling said varactor diode to a load and including an output filter tuned to attenuate harmonics other than the desired output harmonic, said second capacitor being coupled to said varactor diode to provide a bypass between said varactor diode and a reference potential to provide a return path for the output frequency signal, said input circuit and said structure cooperating to provide low impedance paths through said varactor diode for currents of each of the fundamental, low order idler, high order idler and output harmonic frequencies.

2. A frequency multiplier system for receiving an alternating current of a fundamental frequency and multiplying the same an integral number of times to form an output frequency said system including in combination, a varactor diode, a structure including a coaxial line, first and second capacitors, and waveguide means, said varactor diode being positioned in said waveguide means and coupled thereto and being connected to said coaxial line, an input circuit for coupling said coaxial line to means providing the alternating current of fundamental frequency, said input circuit including a low pass filter portion tuned to attenuate harmonics of the fundamental frequency greater than the first harmonic, and a first band pass filter portion tuned to a low order idler harmonic frequency of the fundamental frequency and connected to said coaxial line, said coaxial line having inner and outer conductors, shorting means connecting said conductors and adapted to be positioned along said line whereby said line is tuned, said first capacitor being coupled to said coaxial line and cooperating therewith to provide a second band pass filter tuned to a high order idler harmonic frequency of the fundamental frequency, said waveguide means coupling said varactor diode to a load and including an output filter tuned to attenuate harmonics other than the desired output harmonic, said second capacitor being coupled between said varactor diode and a reference potential to provide a return path for the output frequency signal, said input circuit and said structure cooperating to provide low impedance paths for each of the fundamental low order idler, high order idler and output harmonic currents to circulate through said varactor diode.

3. A frequency multiplier system for receiving an alternating current of a fundamental frequency and multiplying the same at least twenty times to form an output frequency said system including in combination, a varactor diode, a structure including a coaxial line, first and second capacitors, and waveguide means, said varactor diode being positioned in said waveguide means and coupled thereto and being connected to said coaxial line, an input circuit for coupling said coaxial line to means providing the alternating current of fundamental frequency, said input circuit including a low pass filter portion tuned to attenuate harmonics of the fundamental frequency greater than the first harmonic, and a first band pass filter portion tuned to a low order idler harmonic frequency of the fundamental frequency and connected to said coaxial line said first capacitor being coupled to, said coaxial line and cooperating therewith to provide a second band pass filter tuned to a high order idler harmonic frequency of the fundamental frequency, said waveguide means coupling said varactor diode to a load and including an output filter tuned to attenuate harmonics other than the desired output harmonic, said second capacitor being coupled between said varactor diode and a reference potential to provide a return path for the output frequency signal, said input circuit and said structure cooperating to provide low impedance paths for each of the fundamental low order idler, high order idler and output harmonic currents to circulate through said varactor diode.

4. A frequency multiplier including in combination, a transmission line filter structure, an input circuit and a varactor diode, said transmission line filter structure including a hollow bushing of electrically conductive material having a first end substantially closed and a second end substantially open, said first end having an opening therein, a coaxial transmission line positioned within said bushing and having an inner conductor extending through said opening and an outer conductor, first dielectric means separating said outer conductor and said bushing and cooperating therewith to provide a first capacitor, said inner conductor having a shoulder thereon, second dielectric means separating said shoulder and said bushing and cooperating therewith to provide a second capacitor, means coupling said inner conductor to said varactor diode, shorting means coupling said inner and outer conductors, means coupled to said shorting means for changing the position thereof whereby the electrical length of said transmission line is changed, means coupling said outer conductor to said input circuit, and output means coupling said varactor diode to a load.

5. A frequency multiplier including in combination, a transmission line filter structure, an input circuit and a varactor diode, said transmission line filter structure including a hollow cylindrical bushing of electrically conductive material having one end substantially open and the other end substantially closed and having a centrally located circular opening in said closed end, a first hollow cylindrical sleeve of dielectric material and a second hollow cylindrical sleeve of electrically conductive material, said second sleeve being inserted into said open end of said bushing and being spaced apart from said bushing by said first sleeve, said first and second sleeves and said bushing cooperating to provide a first capacitor, first support means including flange means on said first and second sleeves for maintaining said first and second sleeves and said bushing in a fixed relationship, a dielectric washer located inside said bushing adjacent said closed end, said washer having a circular opening therein concentrically positioned with respect to said centrally located circular opening, a circular rod positioned inside said second sleeve said rod having one end extending through said washer and said centrally located circular opening, said one end being adapted to be coupled to said varactor diode, said rod further having a shoulder thereon located adjacent said washer and spaced apart from said bushing by said washer, said bushing, said washer and said shoulder cooperating to provide a second capacitor, second support means for holding said rod in fixed relationship in said bushing, said rod and said second sleeve forming a coaxial transmission line, shorting means coupled to said rod and said second sleeve and adapted to be positioned to change the electrical length of said transmission line, means coupled to said shorting means for changing the position thereof, said second capacitor cooperating to provide a bypass for the output frequency of the frequency multiplier, said first capacitor and said transmission line cooperating to provide a band pass filter tuned to a high order idler harmonic frequency, means coupling said input circuit to said second sleeve and output means coupling said varactor diode to a load, said second sleeve, said shorting means and said rod cooperating to provide means whereby the fundamental frequency and low and high order idler harmonic frequency currents are conducted through said varactor diode.

References Cited by the Examiner

UNITED STATES PATENTS

| | | | |
|---|---|---|---|
| 2,239,905 | 4/1941 | Trevor | 333—73 X |
| 2,408,420 | 10/1946 | Ginzton | 321—69 X |
| 2,460,109 | 1/1949 | Southworth | 332—52 |
| 2,762,986 | 9/1956 | Reed. | |
| 3,281,648 | 10/1966 | Collins | 321—69 |

JOHN F. COUCH, *Primary Examiner.*

G. GOLDBERG, *Assistant Examiner.*